US008415734B2

(12) United States Patent
Sugino et al.

(10) Patent No.: US 8,415,734 B2
(45) Date of Patent: Apr. 9, 2013

(54) MEMORY DEVICE PROTECTION LAYER

(75) Inventors: Rinji Sugino, San Jose, CA (US);
Timothy Thurgate, Sunnyvale, CA (US); Jean Yee-Mei Yang, Glendale, CA (US); Michael Brennan, Campbell, CA (US)

(73) Assignee: Spansion LLC, Sunnyvale, CA (US)

( * ) Notice: Subject to any disclaimer, the term of this patent is extended or adjusted under 35 U.S.C. 154(b) by 1 day.

(21) Appl. No.: 11/608,032

(22) Filed: Dec. 7, 2006

(65) Prior Publication Data
US 2008/0135913 A1   Jun. 12, 2008

(51) Int. Cl.
*H01L 29/76*   (2006.01)

(52) U.S. Cl.
USPC .... 257/314; 257/315; 257/324; 257/E27.103; 257/E29.309

(58) Field of Classification Search .................. 257/324, 257/325, E27.103, E29.309, 314, 315
See application file for complete search history.

(56) References Cited

U.S. PATENT DOCUMENTS

| | | | | |
|---|---|---|---|---|
| 3,864,582 A * | 2/1975 | Keeler | ............................ | 377/105 |
| 5,208,174 A * | 5/1993 | Mori | ................................ | 438/593 |
| 5,304,829 A * | 4/1994 | Mori et al. | ...................... | 257/324 |
| 5,631,179 A * | 5/1997 | Sung et al. | ...................... | 438/264 |
| 5,652,449 A * | 7/1997 | Shinagawa et al. | ............ | 257/316 |
| 5,731,242 A | 3/1998 | Parat et al. | | |
| 6,133,096 A * | 10/2000 | Su et al. | .......................... | 438/264 |
| 6,194,784 B1 * | 2/2001 | Parat et al. | ...................... | 257/774 |
| 6,559,007 B1 * | 5/2003 | Weimer | .......................... | 438/257 |
| 6,596,576 B2 * | 7/2003 | Fu et al. | .......................... | 438/230 |
| 6,608,347 B2 * | 8/2003 | Sato | ................................ | 257/316 |
| 6,790,721 B2 * | 9/2004 | Hurley | ............................ | 438/201 |
| 6,797,619 B2 * | 9/2004 | Jang et al. | ...................... | 438/685 |
| 6,908,816 B1 | 6/2005 | Thurgate et al. | | |
| 6,911,382 B2 * | 6/2005 | Jung et al. | ...................... | 438/533 |
| 6,949,481 B1 * | 9/2005 | Halliyal et al. | ............... | 438/795 |
| 2004/0046206 A1 | 3/2004 | Yun et al. | | |
| 2006/0017111 A1 | 1/2006 | Kamiya et al. | | |

FOREIGN PATENT DOCUMENTS

FR    2 711 275 A1    4/1995

OTHER PUBLICATIONS

Xuejue Huang et al., "Sub 50-nm FinFET: PMOS," 1999 IEEE, IEDM, pp. 67-70.
Yang-Kyu Choi et al., "Nanoscale CMOS Spacer FinFET for the Terabit Era," IEEE Electron Device Letters, vol. 23, No. 1, Jan. 2002, pp. 25-27.
Xuejue Huang et al., "Sub-50 nm P-Channel FinFET," IEEE Transactions on Electron Devices, vol. 48, No. 5, May 2001, pp. 880-886.
Yang-Kyu Choi et al., "Sub-20nm CMOS FinFET Technologies," 2001 IEEE, IEDM, pp. 421-424.
Digh Hisamoto et al., "FinFET—A Self-Aligned Double-Gate MOSFET Scalable to 20 nm," IEEE Transactions on Electron Devices, vol. 47, No. 12, Dec. 2000, pp. 2320-2325.
International Search Report and Written Opinion dated Jun. 9, 2008 issued in corresponding PCT application No. PCT/US2007/086329, 11 pages.

\* cited by examiner

*Primary Examiner* — Robert Huber
(74) *Attorney, Agent, or Firm* — Harrity & Harrity, LLP

(57) ABSTRACT

A memory device includes a group of memory cells formed on a substrate, each memory cell including a source region and a drain region formed in the substrate. The memory device also includes a protection layer formed on top surfaces of the source regions and the drain regions, and on side surfaces of the group of memory cells.

16 Claims, 16 Drawing Sheets

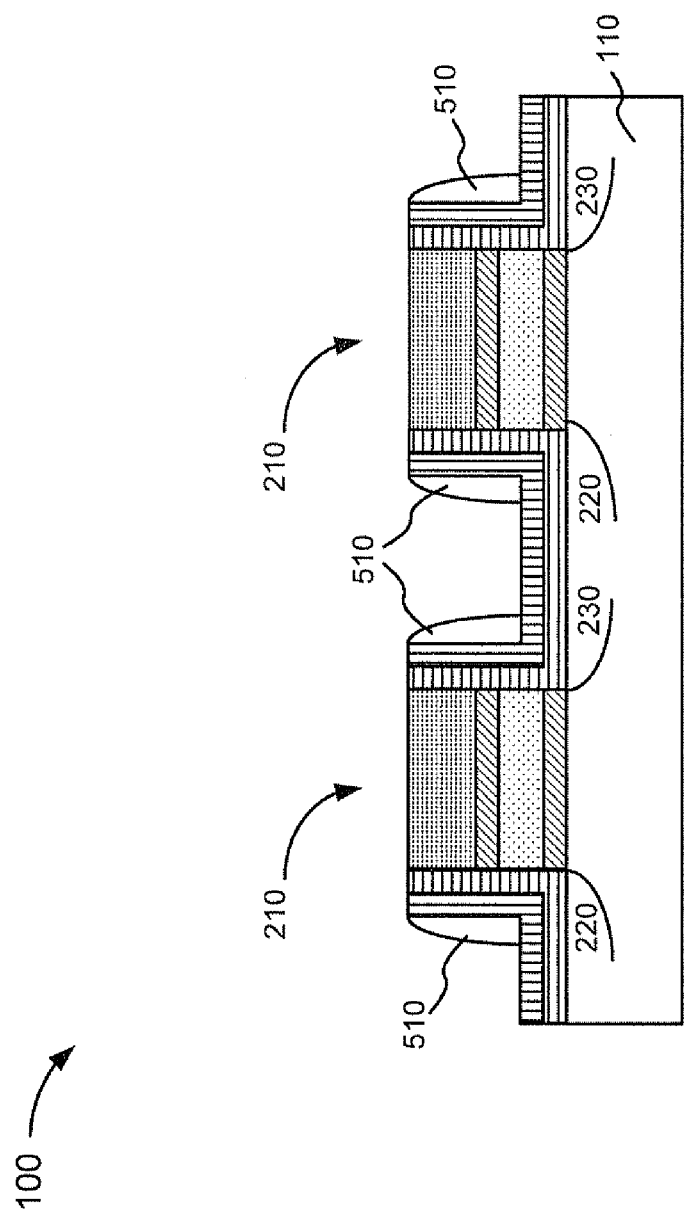

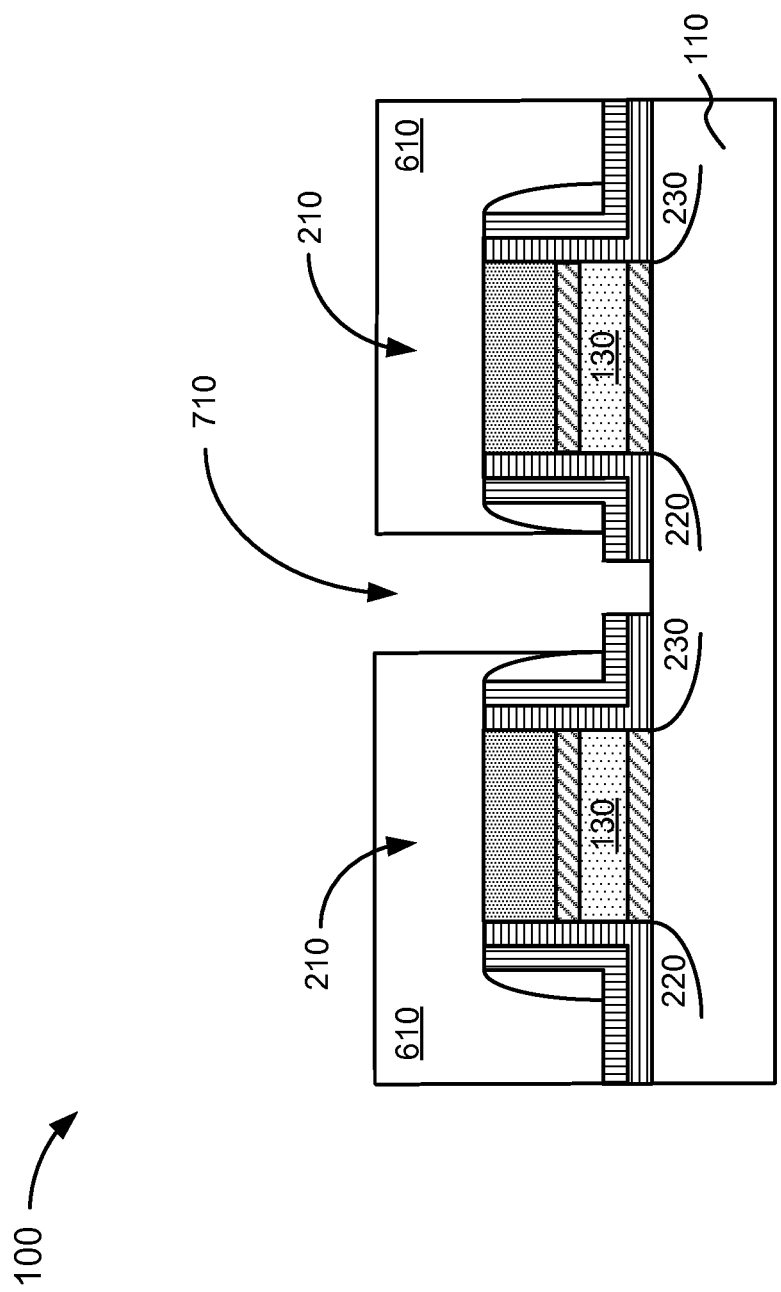

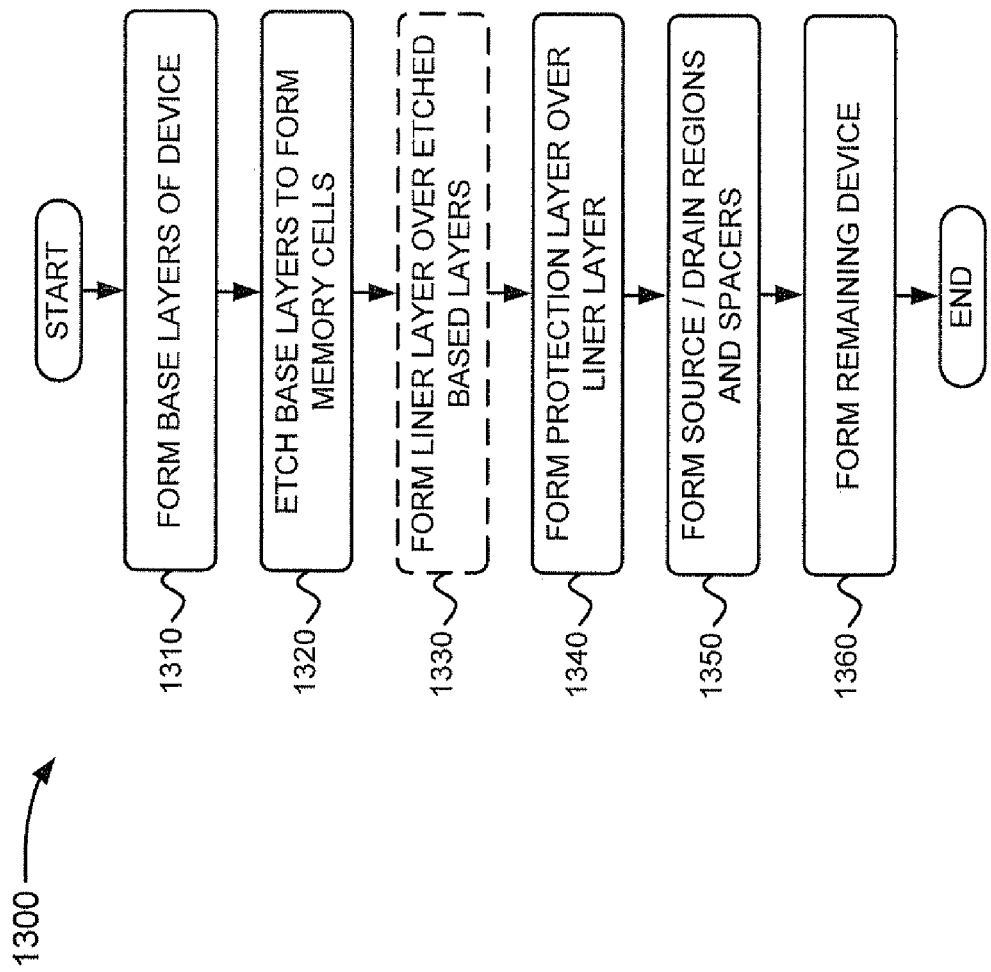

MEMORY DEVICE PROTECTION LAYER

BACKGROUND

1. Field of the Invention

Implementations described herein relate generally to semiconductor devices, and, more particularly, to a memory device protection layer.

2. Description of Related Art

The escalating demands for high density and performance associated with non-volatile memory devices require small design features, high reliability, and increased manufacturing throughput. The reduction of design features below a critical dimension (CD) challenges the limitations of conventional methodologies.

For example, as memory devices are continuously scaled to smaller sizes, there is an ever greater demand to reduce the diffusion of dopants. However, the enhancement of diffusion due to oxidation-enhanced diffusion (OED) poses severe challenges to this goal. Another problem is the growth of a "bird's beak" in the source and/or drain regions of the memory devices. Such bird's beaks grow below the gates of the memory devices and take up valuable circuit real estate. Bird's beaks may also induce stress damage in memory devices due to a mismatch in thermal expansion properties between materials.

Still another problem is penetration of mobile ions during back end of line (BEOL) processing of memory devices. Mobile ions may penetrate the source and/or drain regions of the memory devices, where they may acquire an electron and deposit as a corresponding metal in the source and/or drain regions, destroying the memory devices. Furthermore, mobile ions may also support leakage currents between biased memory device features, which degrade memory device performance and ultimately may destroy the memory device by electrochemical processes, such as metal conductor dissolution.

SUMMARY

According to one aspect, a memory device may include a substrate, a first dielectric layer formed over the substrate, a charge storage layer formed over the first dielectric layer, a second dielectric layer formed over the charge storage layer, and a control gate layer formed over the second dielectric layer. The memory device may also include a source region formed in the substrate, a drain region formed in the substrate, and a protection layer formed on a top surface of the source region and the drain region, and on side surfaces of the first dielectric layer, the charge storage layer, the second dielectric layer, and the control gate layer.

According to another aspect, a memory device may include a substrate, a first dielectric layer formed over the substrate, a charge storage layer formed over the first dielectric layer, a second dielectric layer formed over the charge storage layer, and a control gate layer formed over the second dielectric layer. The memory device may also include a source region formed in the substrate, a drain region formed in the substrate, a liner layer formed on a top surface of the source region and the drain region, and on side surfaces of the first dielectric layer, the charge storage layer, the second dielectric layer, and the control gate layer, and a protection layer formed on a surface of the liner layer.

According to still another aspect, a memory device may include a group of memory cells formed on a substrate. Each memory cell may include a source region and a drain region formed in the substrate. The memory device may also include a protection layer formed on top surfaces of the source regions and the drain regions, and on side surfaces of the group of memory cells.

According to a further aspect, a device may include a memory device that includes a substrate, a first dielectric layer formed over the substrate, a charge storage layer formed over the first dielectric layer, a second dielectric layer formed over the charge storage layer, a control gate layer formed over the second dielectric layer, a source region formed in the substrate, a drain region formed in the substrate, and a protection layer formed on a top surface of the source region and the drain region, and on side surfaces of the first dielectric layer, the charge storage layer, the second dielectric layer, and the control gate layer.

BRIEF DESCRIPTION OF THE DRAWINGS

The accompanying drawings, which are incorporated in and constitute a part of this specification, illustrate an embodiment of the invention and, together with the description, explain the invention. In the drawings:

FIG. 5 is a cross-section illustrating the formation of spacers adjacent the side surfaces of the memory cells of FIG. 4;

FIGS. 7A and 7B are cross-sections illustrating the formation of an exemplary contact in the interlayer dielectric of FIG. 6B;

FIG. 13 is a flowchart of an exemplary process according to an implementation consistent with principles of the invention.

DETAILED DESCRIPTION

The following detailed description of the invention refers to the accompanying drawings. The same reference numbers in different drawings may identify the same or similar elements. Also, the following detailed description does not limit the invention.

Implementations consistent with principles of the invention may relate to protection of memory cells used in memory devices from oxidation-enhanced diffusion, bird's beak formation, and/or mobile ion penetration. By providing a protection layer over the side surfaces of memory cells and over the source and/or drain regions, a memory device may be fabricated that is substantially free from oxidation-enhanced diffusion, bird's beak formation, and/or mobile ion penetration. For example, in one implementation, a nitride protection layer may be provided after formation of the memory cells and/or prior to formation of spacers adjacent the side surfaces of the memory cells.

EXEMPLARY MEMORY DEVICES

Figure 1:
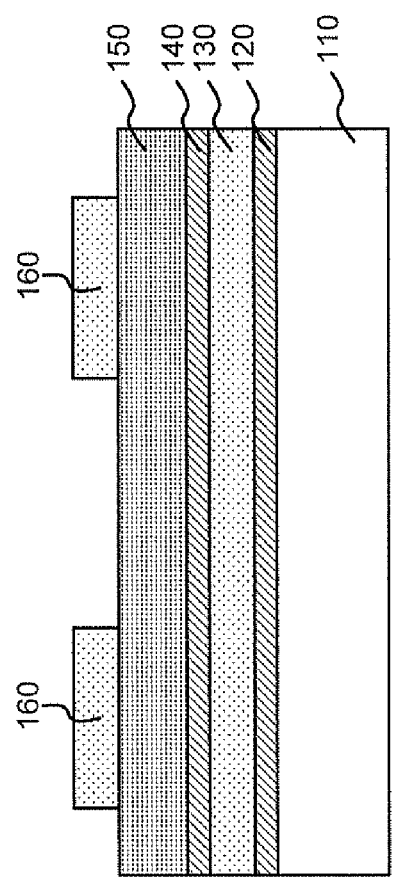
FIG. 1 is a cross-section of exemplary layers used to form memory cells according to implementations consistent with principles of the invention.

FIG. 1 illustrates an exemplary cross-section of a semiconductor device 100 formed in accordance with implementations consistent with principles of the invention. As shown in FIG. 1, semiconductor device 100 may include layers 110, 120, 130, 140, and 150. In one implementation, layer 110 may correspond to a substrate of semiconductor device 100 and may include silicon, germanium, silicon-germanium or other semiconducting materials. In another implementation, layer 110 may correspond to a conductive layer or a dielectric layer formed a number of layers above the surface of a substrate in semiconductor device 100.

Layer 120 may correspond to a dielectric layer formed on layer 110 in a conventional manner. In one implementation, dielectric layer 120 may include an oxide, such as a silicon oxide (e.g., $SiO_2$), and may have a thickness ranging from, for example, about 30 angstroms (Å) to about 100 Å. Dielectric layer 120 may function as a tunnel oxide layer for a subsequently formed memory cell of semiconductor device 100.

Layer 130 may be formed on layer 120 in a conventional manner and may include a dielectric material, such as a nitride (e.g., a silicon nitride) or an oxynitride. Layer 130, in one implementation, may act as a charge storage layer for semiconductor device 100 and may have a thickness ranging from, for example, about 40 Å to about 100 Å. In another implementation, layer 130 may include a conductive material, such as polycrystalline silicon, which may form a floating gate electrode. In this implementation, layer 130 may have a thickness ranging from about 500 Å to about 1,000 Å.

Layer 140 may be formed on layer 130 in a conventional manner and may include a dielectric material, such as an oxide (e.g., $SiO_2$). In one implementation, layer 140 may include another material having a high dielectric constant (K), such as aluminum oxide or hafnium oxide, which may be deposited or thermally grown on layer 130. In another implementation, layer 140 may be a composite that includes a number of dielectric layers or films. Layer 140 may have a thickness ranging from, for example, about 40 Å to about 100 Å and may function as an inter-gate dielectric for memory cells in semiconductor device 100.

Layer 150 may include a conductive material, e.g., polycrystalline silicon, formed on layer 140 in a conventional manner. In one implementation, layer 150 may include other semiconducting materials, such as germanium or silicon-germanium, or various metals, such as titanium or tungsten. Layer 150, in one implementation, may form one or more control gate electrodes for one or more memory cells in semiconductor device 100. In another implementation, layer 150 may have a thickness ranging from, for example, about 1,000 Å to about 2,000 Å.

A photoresist material may be patterned and etched to form masks 160 on the top surface of layer 150, as illustrated in FIG. 1. In one implementation, the particular configuration of masks 160 may be based on the particular circuit requirements associated with the memory cell for semiconductor device 100. For example, the photoresist material may be patterned and trimmed to form masks (e.g., masks 160) designed to achieve very small critical dimensions associated with a subsequently formed memory cell.

Figure 2:
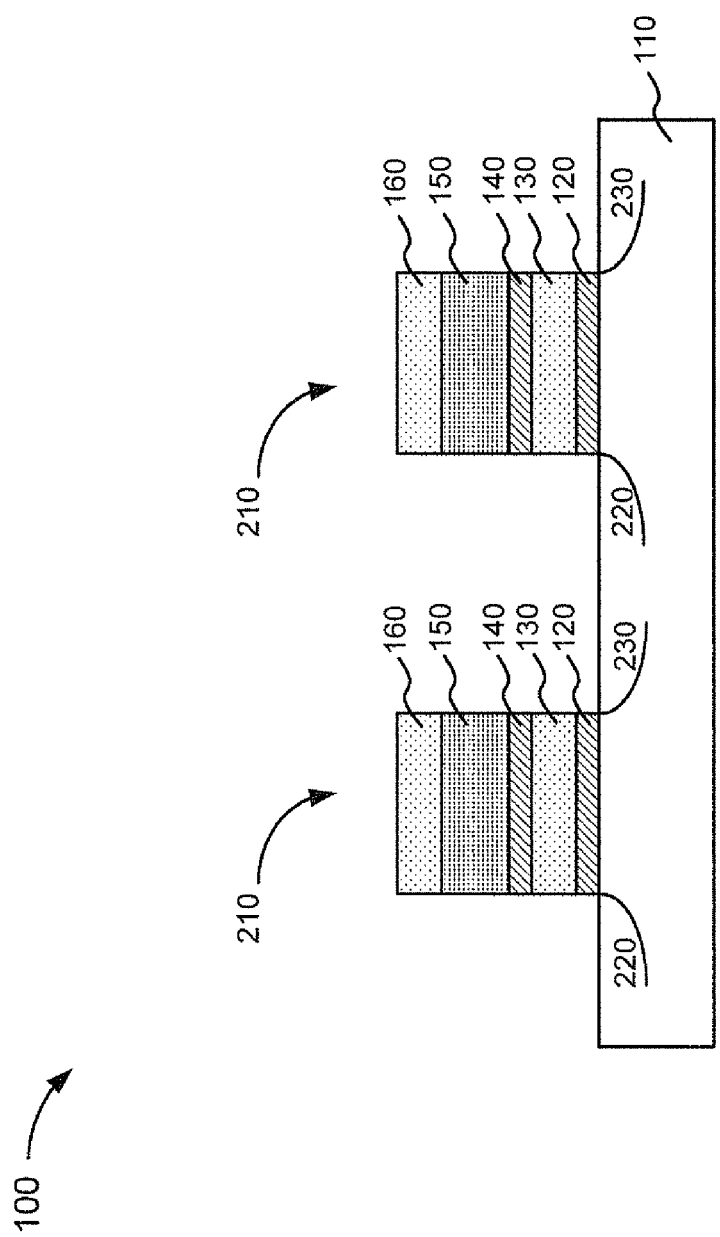
FIG. 2 is a cross-section illustrating the formation of memory cells according to implementations consistent with principles of the invention.

Semiconductor device 100 may be etched using masks 160 to achieve particular critical dimensions for each memory cell. FIG. 2 is a cross-section illustrating the formation of memory cells. Referring to FIG. 2, layers 120-150 may be etched, and the etching may terminate at substrate 110 to form structures 210. Alternatively, the etching may terminate at another layer, e.g., layer 140, followed in one implementation by additional etching, to form structures 210. Each structure 210 (also referred to herein as a memory cell 210) may represent a memory cell of semiconductor device 100. Each memory cell 210 may include a dielectric layer 120, a charge storage layer 130, an inter-gate dielectric layer 140, and a control gate electrode 150. Although only two memory cells 210 are illustrated in semiconductor device 100 of FIG. 2 for simplicity, semiconductor device 100 may include more or fewer memory cells 210. For example, semiconductor device 100 may include a memory array with a large number of memory cells 210. After etching, masks 160 may be stripped from semiconductor device 100 using a conventional process.

As further shown in FIG. 2, source and drain regions 220 and 230 may be formed in substrate 110. For example, n-type or p-type impurities may be implanted in substrate 110 to form source and drain regions 220 and 230, based on the particular end device requirements. In one implementation, an n-type dopant, such as phosphorous or arsenic, may be implanted. In another implementation, a p-type dopant, such as boron, may be implanted. The particular implantation dosages and energy used to form source and drain regions 220 and 230 may be selected based on the particular end device requirements. Source region 220 and drain region 230 may alternatively be formed at other points in the fabrication process of semiconductor device 100. For example, sidewall spacers may be formed prior to the source/drain ion implantation to control the location of the source/drain junctions based on the particular circuit requirements.

Optional Liner Layer

Figure 3:
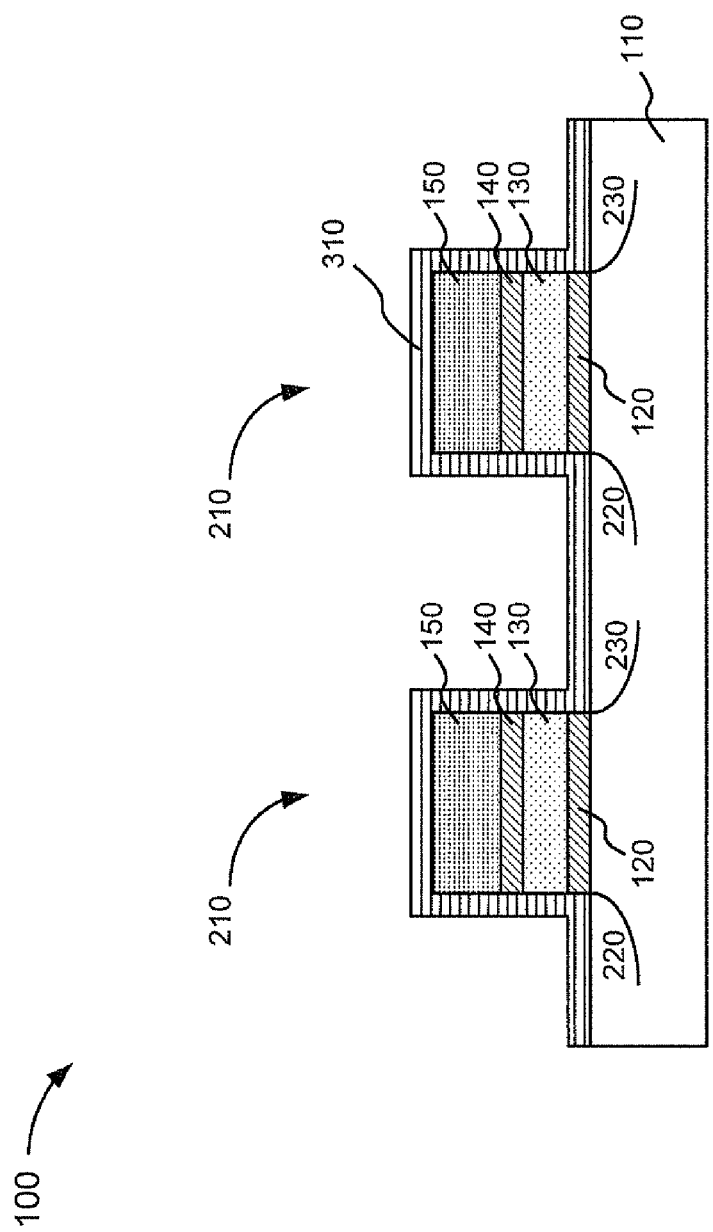
FIG. 3 is a cross-section illustrating the formation of an optional liner layer according to implementations consistent with principles of the invention.

FIG. 3 is a cross-section illustrating the formation of an optional liner layer 310 according to implementations consistent with principles of the invention. As shown in FIG. 3, optional liner layer 310 may be formed over the entire surface of semiconductor device 100. Liner layer 310 may be formed on semiconductor device 100 in a conventional manner and may include a dielectric material, such as an oxide (e.g., $SiO_2$, a high quality oxide that includes a high breakdown voltage, etc.). Liner layer 310, in one implementation, may address electrical breakdown issues for semiconductor device 100. In this implementation, liner layer 310 may have a thickness ranging from, for example, about 50 Å to about 500 Å. In another implementation, liner layer 310 may have a thickness ranging from, for example, about 50 Å to about 150 Å.

Although FIG. 3 shows formation of liner layer 310 on the top surface of semiconductor device 100, liner layer 310 may be omitted from the fabrication of device 100 (as shown and described below in connection with FIG. 12B) in other implementations consistent with principles of the invention.

Protection Layer

Figure 4:
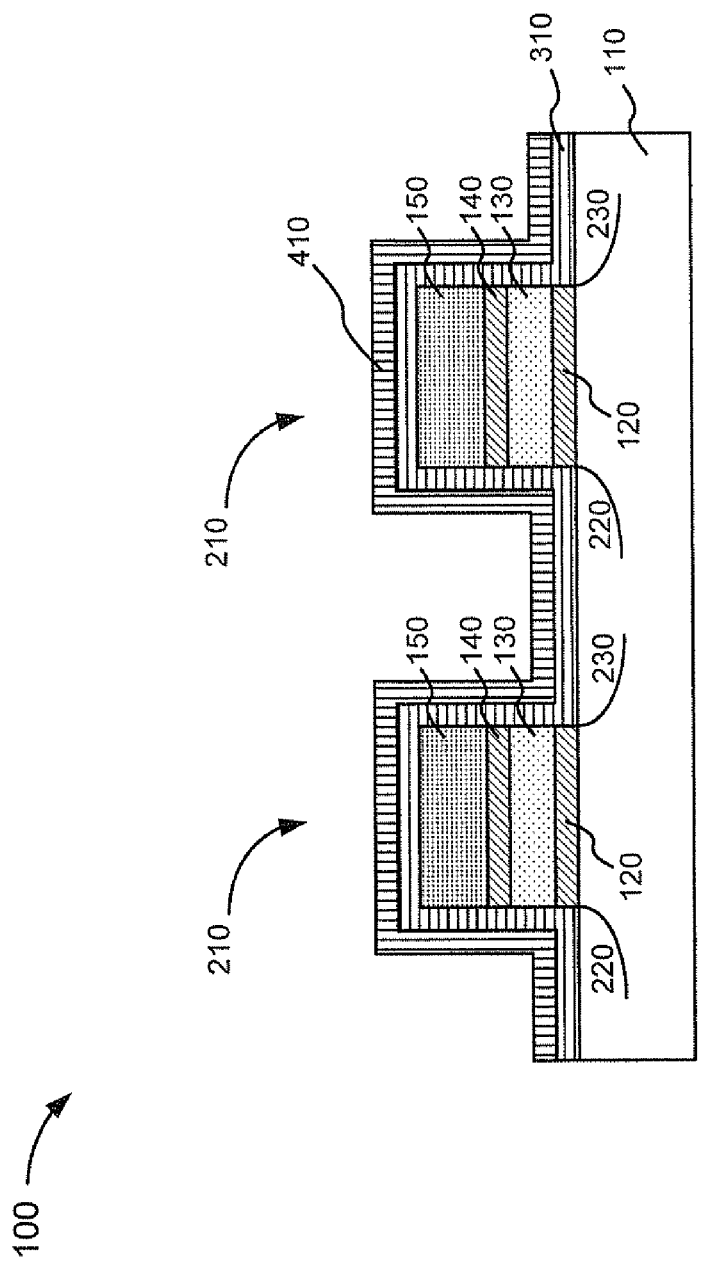
FIG. 4 is a cross-section illustrating the formation of a protection layer according to implementations consistent with principles of the invention.

FIG. 4 is a cross-section illustrating the formation of a protection layer 410 according to implementations consistent with principles of the invention. In one implementation, as shown in FIG. 4, protection layer 410 may be formed over the entire surface of liner layer 310. In another implementation, if liner layer is omitted 310 protection layer 410 may be formed over the entire surface of semiconductor device 100.

Protection layer 410, in one implementation, may be formed on semiconductor device 100 in a conventional manner and may include a dielectric material, such as a nitride (e.g., a silicon nitride, a silicon-rich nitride, etc.), an oxynitride, another dielectric material capable of preventing diffusion of oxygen, etc. Protection layer 410 may minimize and/or prevent oxidation-enhanced diffusion, may minimize and/or prevent formation of bird's beaks below memory cells 210, and/or may minimize and/or prevent mobile ion penetration in semiconductor device 100 from back end of line (BEOL) processing. In this implementation, protection layer 410 may have a thickness ranging from, for example, about 50 Å to about 500 Å. In another implementation, protection layer 410 may have a thickness ranging from, for example, about 50 Å to about 150 Å.

Although FIGS. 3 and 4 show formation of protection layer 410 on the top surface of liner layer 310, in one implementation consistent with principles of the invention, liner layer 310 may be provided on the top surface of protection layer 410.

During subsequent processing of semiconductor device 100, some additional oxidation may occur in substrate 110. This may cause bottom oxide layers (e.g., dielectric layers 120) to thicken. However, dielectric layers 120 may not thicken uniformly, i.e., the end portions of dielectric layers 120, adjacent to source regions 220 and/or drain regions 230, may become thicker than the central portions of dielectric layers 120. This may create an undesirable situation where each dielectric layer 120 may not have a uniform thickness across the entire channel of its corresponding memory cell 210. The same effect may occur in top oxide layers (e.g., dielectric layers 140), but gate electrodes 150 may be the source of oxidation rather than substrate 110.

Protection layer 410 may minimize and/or prevent non-uniform thickening of dielectric layer 120 and/or 140. Protection layer 410 may also or alternatively minimize and/or prevent oxygen from oxidizing substrate 110 and/or gate electrodes 150. This may minimize bird's beak formation in source regions 220 and/or drain regions 230. Protection layer 410 may also minimize and/or prevent diffusion of oxygen in substrate 110 and/or gate electrodes 150 in subsequent processing steps, which may minimize and/or prevent non-uniform thickening of dielectric layer 120 and/or 140.

Furthermore, any time substrate 110 may be subject to oxidation in subsequent processes, diffusion of implanted ions may be enhanced. That is, implanted ions may diffuse more readily if oxidation is occurring in a process (e.g., oxidation-enhanced diffusion). This may have a negative impact on semiconductor device 100 because any increase in diffusion may result in shorter channel lengths for semiconductor device 100, which may result in device scaling problems. Protection layer 410 may minimize and/or prevent such oxidation from occurring, and therefore may reduce or even eliminate oxidation-enhanced diffusion.

Formation of Additional Features of Semiconductor Device

The description of the formation of the remaining portions of semiconductor device 100, as described in connection with FIGS. 5-12B, will be provided with reference to memory cells 210 shown in FIG. 4. In an exemplary implementation consistent with the invention, each memory cell 210 may be a SONOS-type memory cell, with a silicon control gate electrode 150 formed on an oxide-nitride-oxide (ONO) stack (i.e., layers 140, 130 and 120), with nitride layer 130 acting as a charge storage layer, and the ONO stack being formed on a silicon substrate 110. In another implementation, each memory cell 210 may be a floating gate memory cell, with a silicon control gate electrode 150, an inter-gate dielectric 140, a polysilicon floating gate electrode 130 and a tunnel oxide layer 120 formed on substrate 110.

After formation of optional liner layer 310 and protection layer 410, the top portions of liner layer 310 and/or protection layer 410 provided over gate electrodes 150 may be removed with conventional chemical processing. For example, in one implementation, a filler material (e.g., an oxide) may be provided over the top surface of device to fill spaces between memory devices 210, and a wet or dry chemical etch may be performed using a chemical that may selectively remove the top portion of protection layer 410. The filler material may be subsequently removed. In another implementation, a wet or dry chemical etch may be performed on liner layer 310 using a chemical that may selectively remove the top portion of liner layer 310.

In an implementation consistent with principles of the invention, another layer of a conductive material, e.g., polycrystalline silicon, may be formed and etched over gate electrodes 150 in a conventional manner. Additional conductive material layer may combine with gate electrodes 150, and the combination may be referred to hereinafter as gate electrodes 150. In another implementation, the addition to gate electrodes 150 may occur prior to formation of optional liner layer 310 and/or protection layer 410.

After the top portions of optional liner layer 310 and protection layer 410 have been removed and/or after addition to gate electrodes 150, spacers 510 may be formed adjacent the sidewalls of the memory cells 210, as illustrated in FIG. 5. For example, a dielectric material (e.g., a silicon oxide, a silicon nitride, a silicon oxynitride or another dielectric material) may be deposited and etched to form spacers 510 on each side of memory cells 210, as shown in FIG. 5. Spacers 510 may electrically isolate adjacent memory cells 210 from each other. Spacers 510 may also be used to facilitate the deposition of impurities in semiconductor device 100.

A metal may optionally be deposited over semiconductor device 100, followed by an annealing to form a metal-silicide compound. For example, in one implementation, a metal (e.g., cobalt, titanium or nickel) may be deposited over the surface of semiconductor device 100. An annealing procedure may be performed to form a metal-silicide layer (not shown) over control gate electrodes 150. The metal-silicide may also be formed over source/drain regions 220 and 230. Unreacted metal may be removed from spacers 510.

Figure 6A:
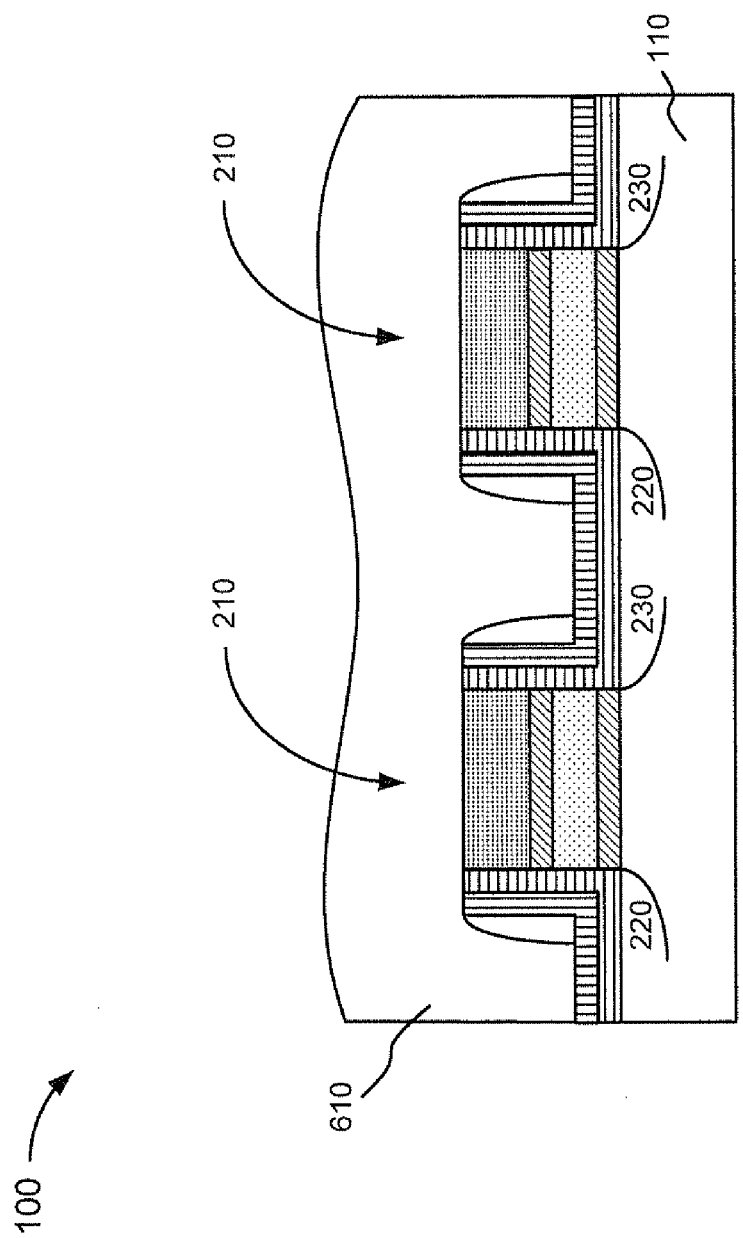
FIGS. 6A and 6B are cross-sections illustrating the formation of an interlayer dielectric on the device of FIG. 5.

A dielectric layer 610 may then be deposited over semiconductor device 100, as illustrated in FIG. 6A. Dielectric layer 610, also referred to as interlayer dielectric (ILD) 610, may include, for example, an oxide (e.g., $SiO_2$), a borophosphosilicate glass (BPSG) material or a phosphosilicate glass (PSG) material. Dielectric layer 610 may have a thickness ranging from about 6,000 Å to about 10,000 Å.

Figure 6B:
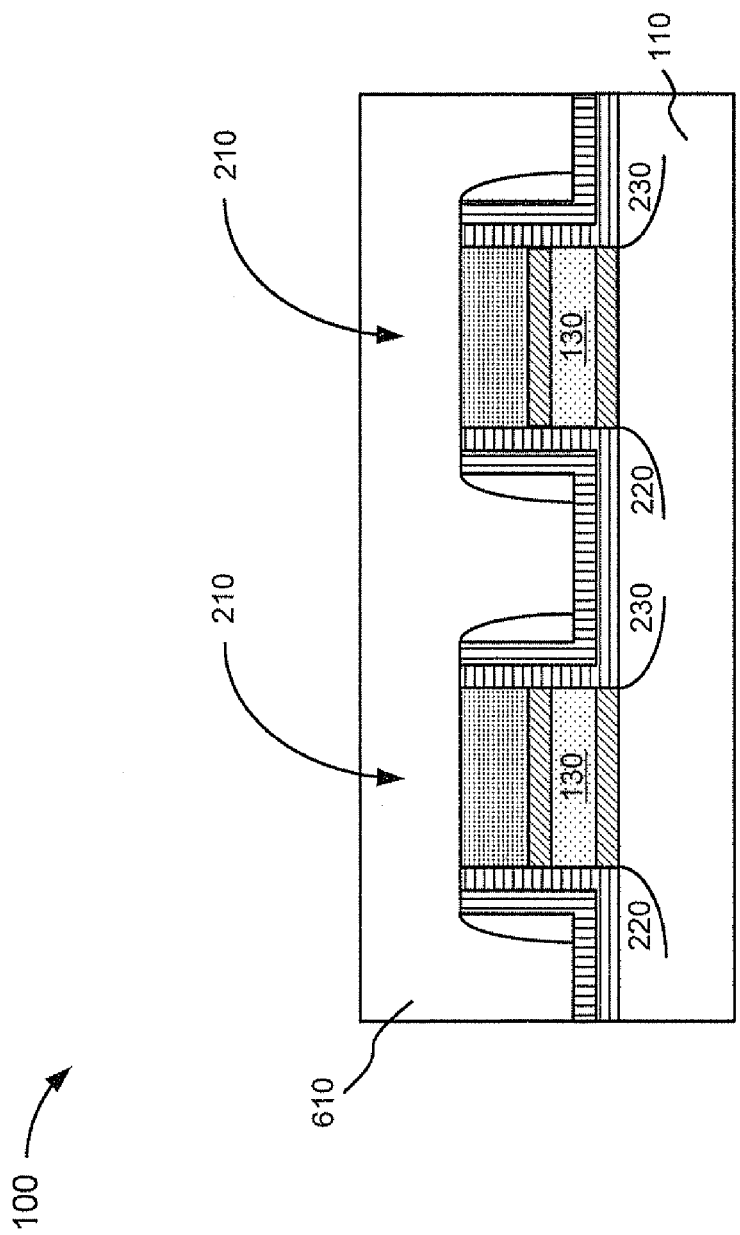

ILD 610 may optionally be planarized using a conventional process, such as a chemical-mechanical polishing (CMP) process, as illustrated in FIG. 6B. Referring to FIG. 6B, the CMP process may planarize the top surface of ILD 610 to facilitate formation of subsequent structures, such as interconnect lines. In one implementation, ILD 610 may represent an ILD located closest to substrate 110. In another implementation, ILD 610 may represent an interlayer dielectric formed a number of layers above the surface of substrate 110. In each case, ILD 610 may function to isolate various conductive structures, such as various interconnect lines described below or to isolate source region 220 or drain region 230 from other conductive structures.

A trench 710, which may be referred to as a contact hole 710, may be formed in ILD 610 using conventional photolithographic and etching techniques, as illustrated in FIG. 7A.

Contact hole 710 may form a contact to a source region (e.g., source region 220) and/or a drain region (e.g., drain region 230) of memory cells 210.

Figure 7B:
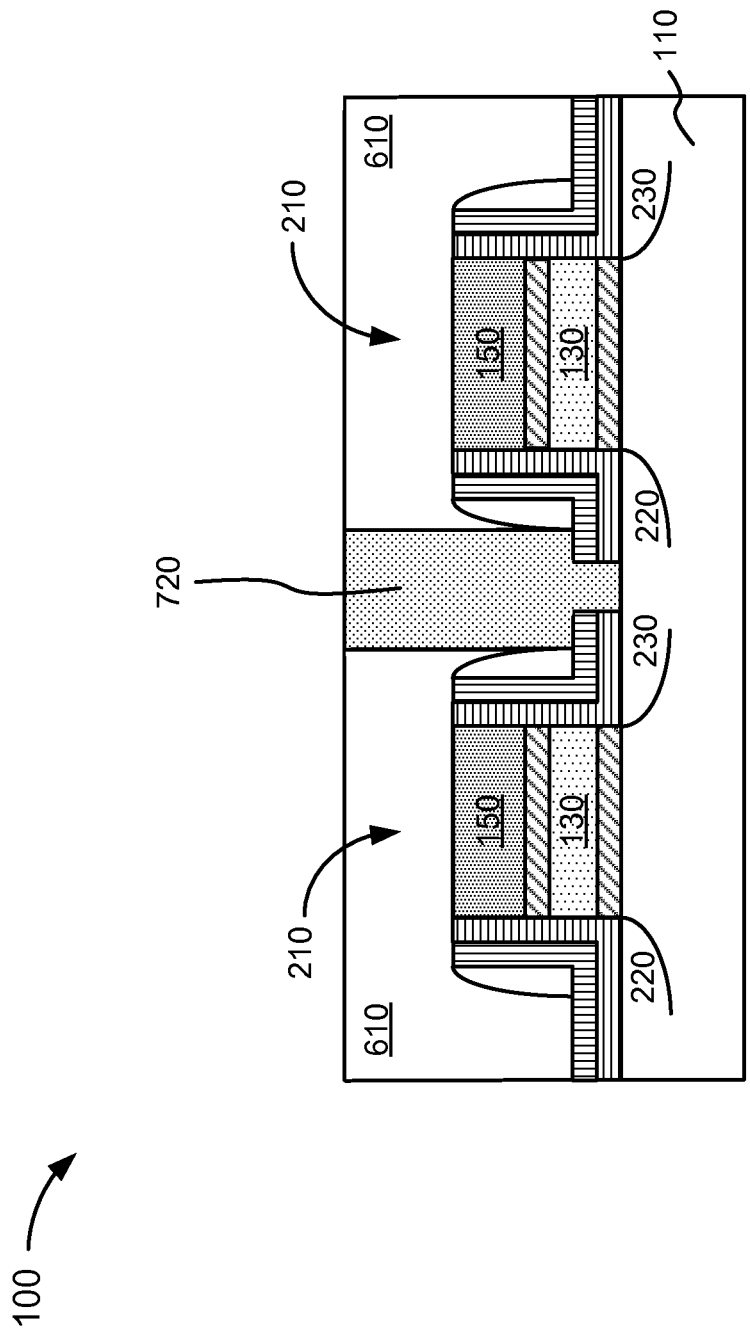

A metal layer (e.g., tungsten, copper, or aluminum) may be deposited to fill contact hole 710 to form a contact 720, as illustrated in FIG. 7B. Contact 720 may represent a contact to, for example, drain region 230 of a memory cell (e.g., memory cell 210 located on the left side of FIG. 7B) and to source region 220 of an adjacent memory cell (e.g., memory cell 210 located on the right side of FIG. 713). Drain region 230 of the left memory cell 210 in FIG. 7B and source region 220 of the adjacent memory cell 210 in FIG. 7B may be coupled together to form a bit line. The bit line may be coupled to a column of memory cells 210 (not shown) in a memory cell array. Contact 720 may apply programming and/or erasing voltages to the bit line associated with a column of memory cells 210 depending upon the particular circuit requirements. Although only one contact 720 is illustrated in FIG. 73, semiconductor device 100 may include multiple contacts 720 that may apply voltages to bit lines and/or word lines in semiconductor device 100.

Figure 8:
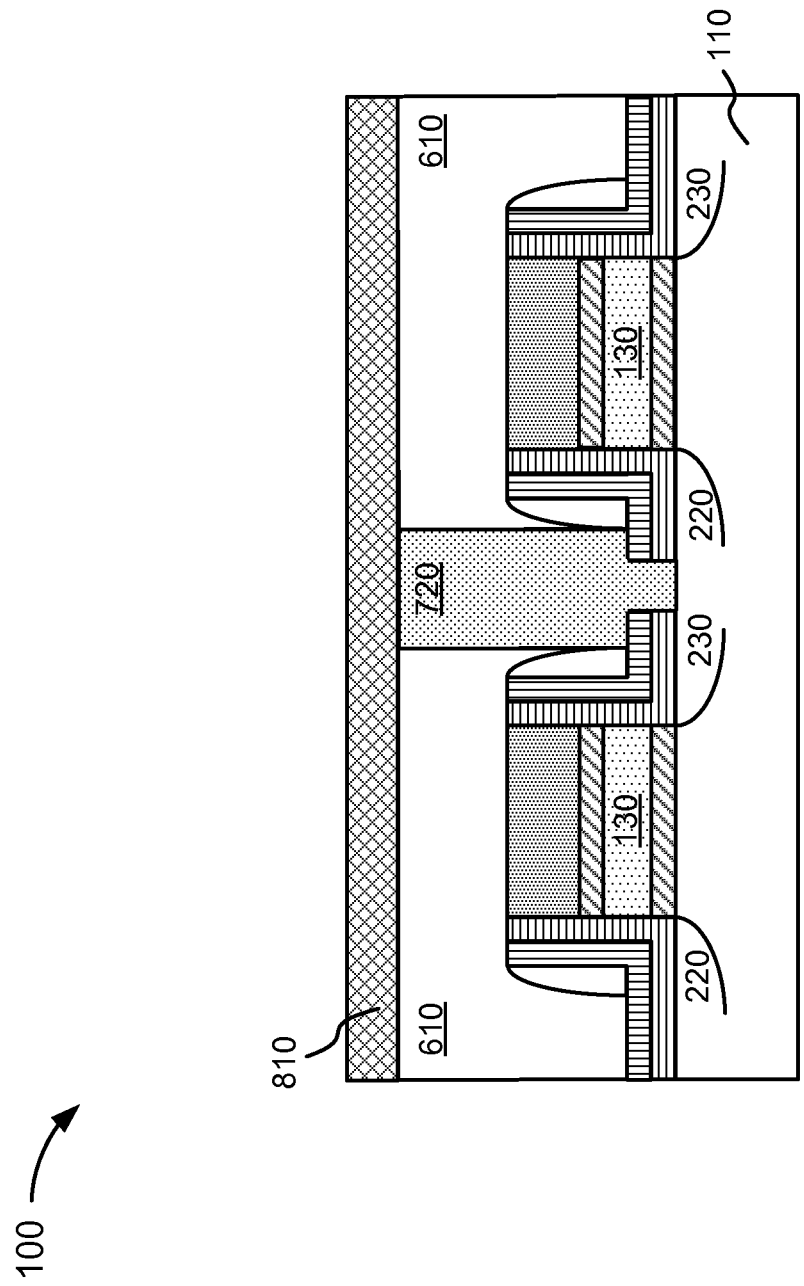
FIG. 8 is a cross-section illustrating the formation of a conductive layer on the device of FIG. 7B.

Excess portions of the metal used to form contact 720 may form over portions of dielectric layer 610. Such excess portions of metal may be removed, in one implementation, by a planarization process (e.g., a CMP process). A conductive interconnect line 810 may be formed over the planarized top surfaces of ILD 610 and contact 720, as shown in FIG. 8. For example, a metal (e.g., tungsten, copper or aluminum) may be deposited to form conductive line 810. In one implementation, conductive line 810 may connect various features in semiconductor device 100 (e.g., source region 220 and/or drain region 230), through contact 720, to an external electrode (not shown). In another implementation, conductive line 810 may connect various memory cells 210 in semiconductor device 100. Conductive line 810 may facilitate programming and/or erasing various memory cells 210 in semiconductor device 100.

Figure 9:
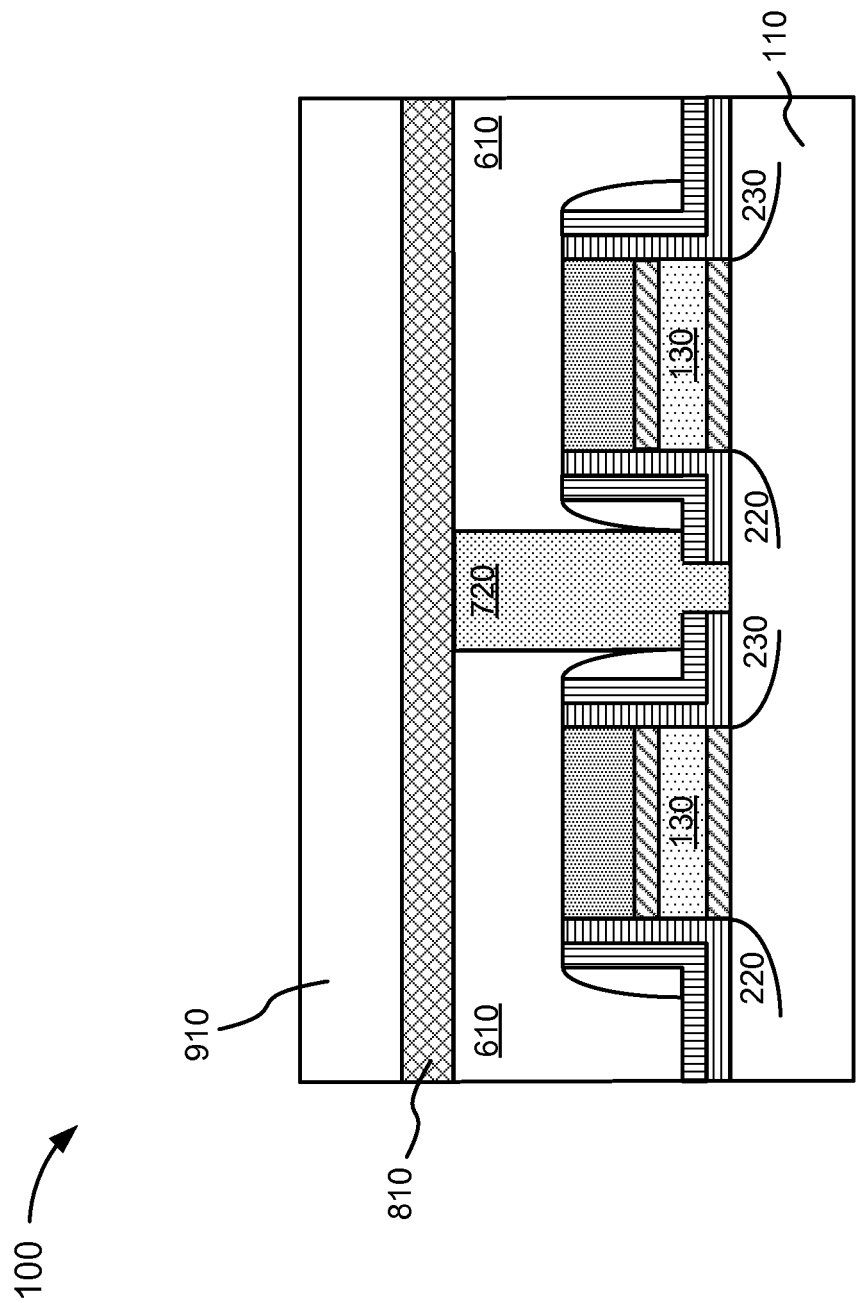
FIG. 9 is a cross-section illustrating the formation of an interlayer dielectric on the device of FIG. 8.

An ILD 910 may be formed over conductive line 810, as illustrated in FIG. 9. In one implementation, ILD 910 may include, for example, an oxide, a PSG, a BPSG material or another dielectric material. ILD 910 may have a thickness ranging from about 2,500 Å to about 3,500 Å.

Figure 10:
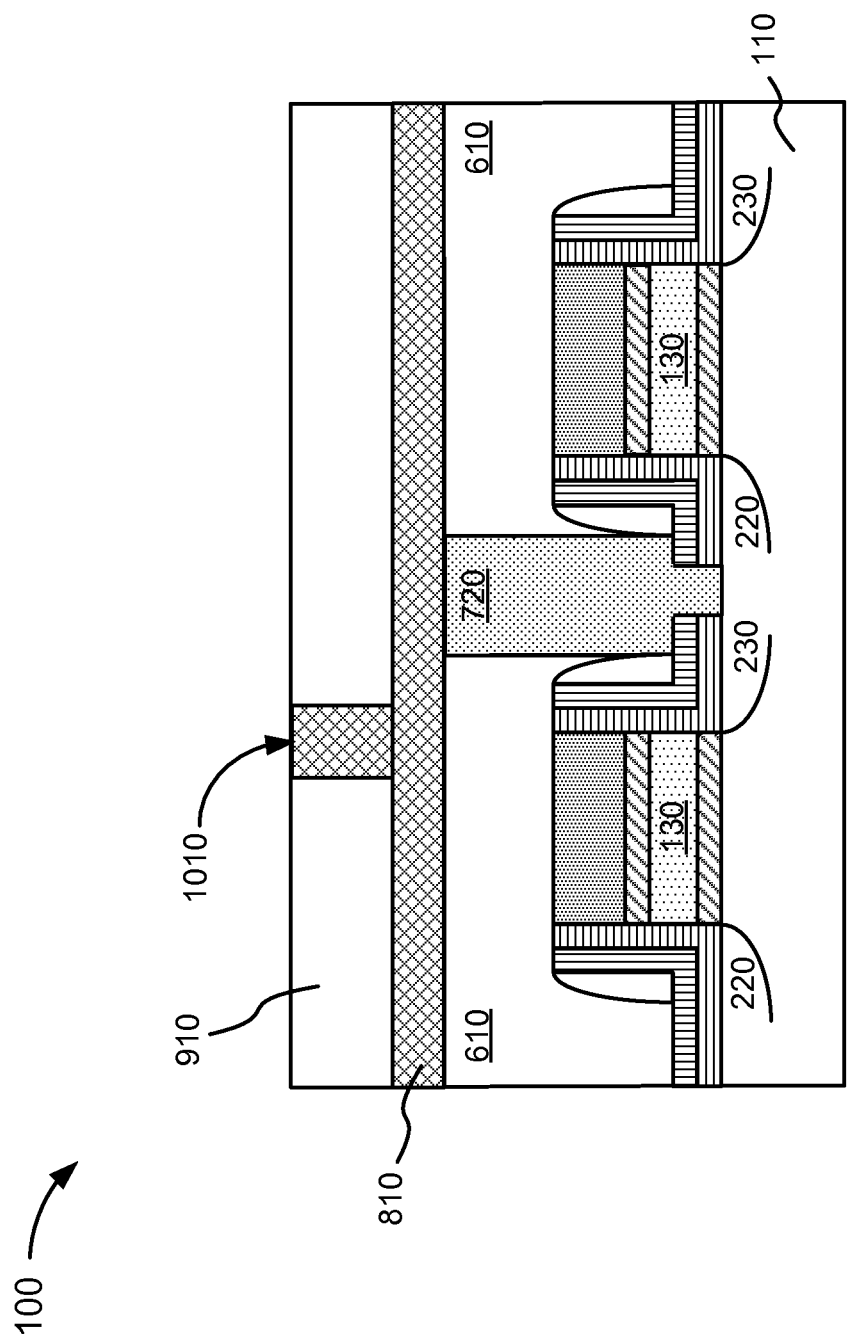
FIG. 10 is a cross-section illustrating the formation of a via in the interlayer dielectric of FIG. 9.

Various back end of line (BEOL) processing may be performed to complete the fabrication of semiconductor device 100. For example, a trench may be formed in ILD 910 followed by deposition of a metal layer (e.g., copper, aluminum or tungsten) to form a via 1010, as illustrated in FIG. 10. Via 1010 may represent a connection to an uppermost conductive layer of semiconductor device 100. Alternatively, via 1010 may represent a connection to any one of a number of conductive layers in semiconductor device 100.

Figure 11:
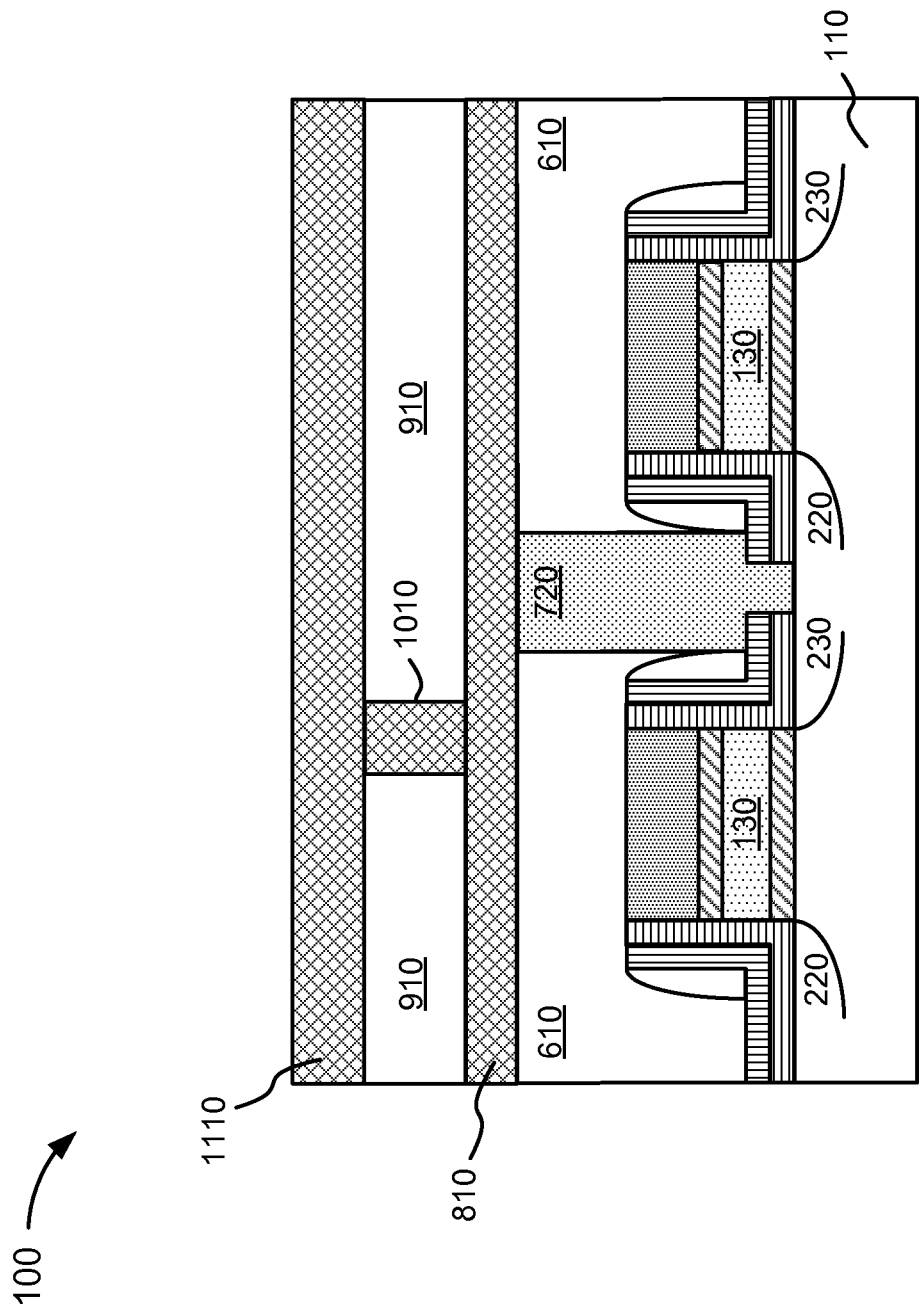
FIG. 11 is a cross-section illustrating the formation of a conductive layer on the device of FIG. 10.

A conductive layer may then be formed over ILD 910 and via 1010. For example, a metal (e.g., copper or aluminum) may be deposited to form conductive Line 1110, as illustrated in FIG. 11. Conductive line 1110 may represent a BEOL structure or connector that may connect various features in semiconductor device 100 (e.g., source and/or drain regions 220/230 to an external electrode (not shown)) to facilitate programming and/or erasing of various memory cells 210 in semiconductor device 100.

Figure 12A:
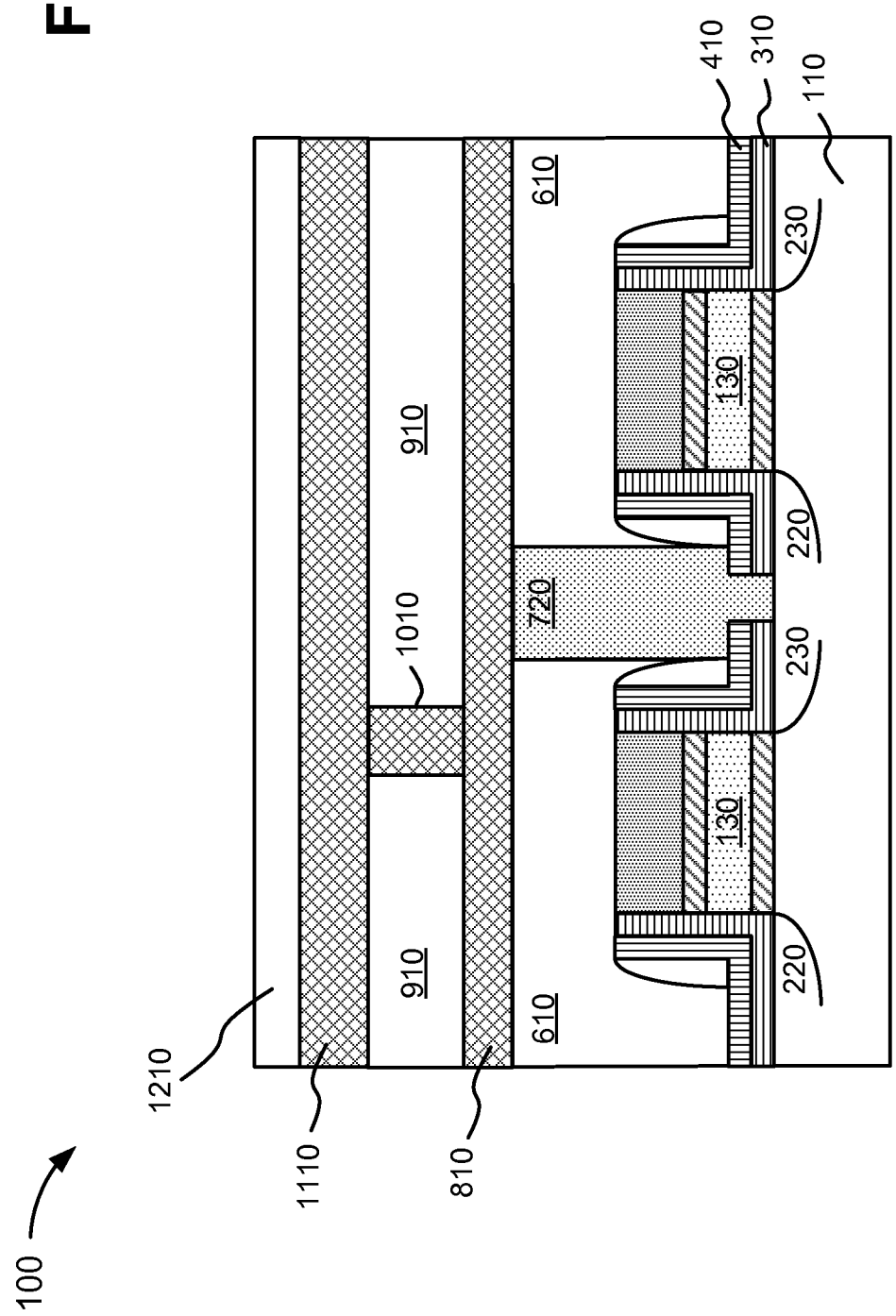
FIG. 12A is a cross-section illustrating the formation of a dielectric layer on the device of FIG. 11.
Figure 12B:
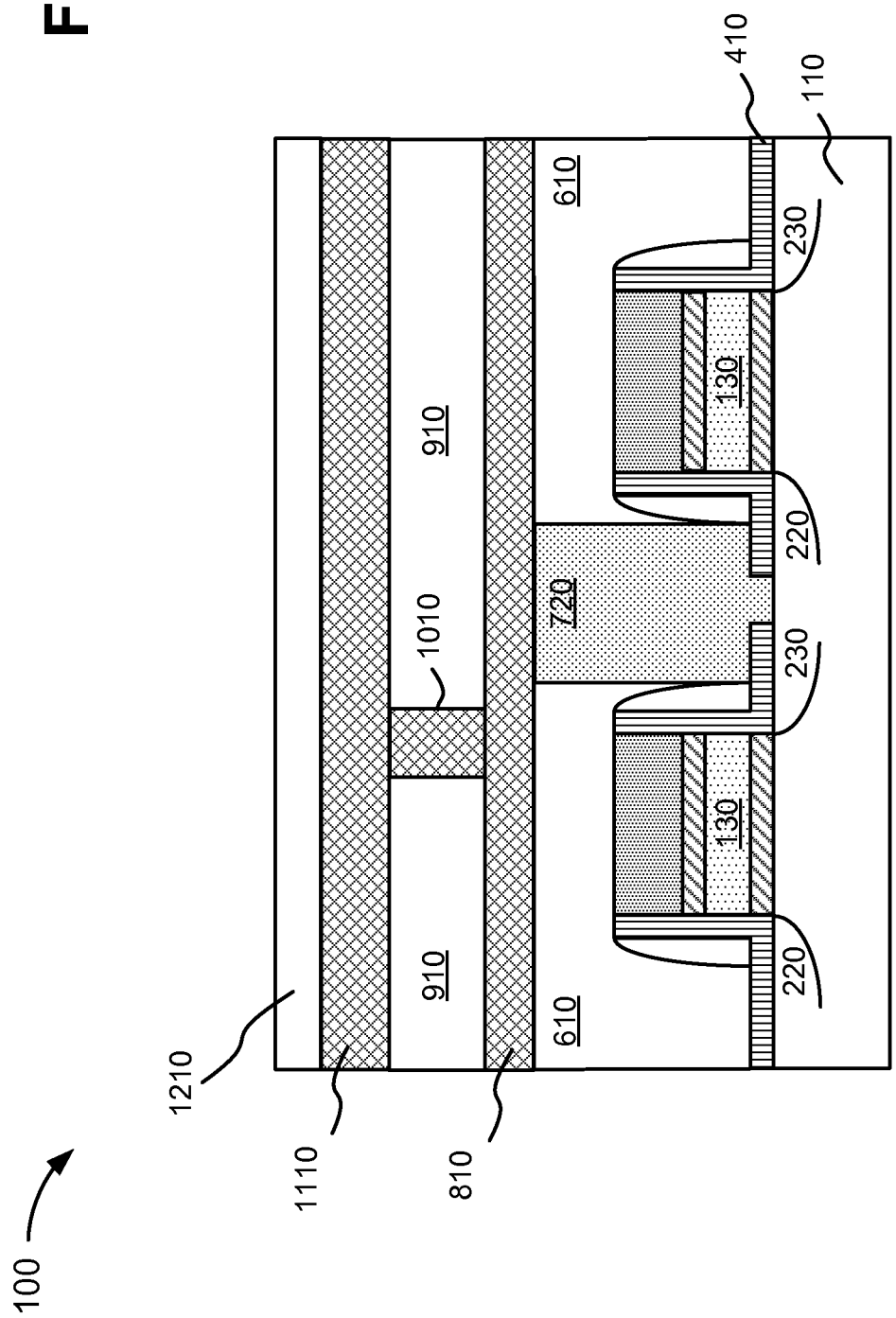
FIG. 12B is a cross-section illustrating the formation of a dielectric layer on the device of FIG. 11, where the optional liner layer has been omitted.

A top dielectric layer 1210, also referred to as a cap layer 1210, may be formed over conductive line 1110, as shown in FIGS. 12A and 12B. Semiconductor device 100 of FIGS. 12A and 12B contain similar components except that the device shown in FIG. 12B omits optional liner layer 310 shown in FIG. 12A.

In one implementation, cap layer 1210 may be deposited to a thickness ranging from about 6,000 Å to about 10,000 Å. Cap layer 1210 may act as a protective layer to minimize and/or prevent damage to conductive line 1110 and other portions of semiconductor device 100 during subsequent processing. For example, cap layer 1210 may protect semiconductor device 100 against impurity contamination during subsequent cleaning processes that may be used to complete a working memory device.

While only two ILDs (i.e., ILDs 610 and 910) and two conductive layers (i.e., layers 810 and 1010) are illustrated in FIG. 12A for simplicity, semiconductor device 100 may include more or less ILD layers and conductive layers based on the particular circuit requirements.

As described above, in one implementation, semiconductor device 100 illustrated in FIGS. 12A and 12B may be a SONOS type memory device, with nitride layer 130 acting as a charge storage element for each memory cell 210. Each memory cell 210 may be an EEPROM type memory device and one or more programming circuits (not shown) may facilitate programming and erasing of one or more memory cells 210 of semiconductor device 100. Programming of each memory cell 210 may be accomplished by applying a voltage to its control gate 150. Once programmed, electrons remain trapped in nitride layer 130 until an erase procedure is performed.

In an implementation consistent with principles of the invention, each memory cell 210 may be configured to store two or more bits of data. For example, charge storage layer 130 for each memory cell 210 may be programmed to store charges representing two separate bits of data by localizing the first and second charges to the respective left and right sides of charge storage layer 130 illustrated in FIGS. 12A and 12B. Each of the two bits of memory cell 210 may be programmed independently (e.g., by channel hot electron injection) to store charges representing a bit on each respective side of the charge storage layer 130. In this manner, the charges in charge storage layer 130 may become effectively trapped on each respective side of charge storage layer 130. Erasing of each bit in memory cell 210 may also be performed independently. During erasing, the charges stored in charge storage layer 130 may tunnel through dielectric layer 120 into source region 220 and drain region 230, respectively. In another implementation, charge storage layer 130 for each memory cell 210 may be configured to store charges representing three or more bits of data by localizing the charges in charge storage layer 130.

In an alternative implementation, each memory cell 210 may be configured to store a charge representing one bit of data per memory cell 210. In addition, in alternative implementations, semiconductor device 100 may be a floating gate memory device in which layer 130 is formed from a conductive material (e.g., polysilicon) that functions as a charge storage element for each memory cell 210.

EXEMPLARY PROCESSES

FIG. 13 is a flowchart of an exemplary process or method according to an implementation consistent with principles of the invention. As shown in FIG. 13, a process 1300 may form base layers of a semiconductor device (block 1310). For example, in one implementation described above in connection with FIG. 1, semiconductor device 100 may be formed from base layers that include substrate layer 110, first dielectric layer 120 formed on substrate layer 110, charge storage layer 130 formed on first dielectric layer 120, second dielectric layer 140 formed on charge storage layer 130, and conductive layer 150 formed on second dielectric layer 140.

Process 1300 may etch the base layers of the semiconductor device to form memory cells (block 1320). For example, in one implementation described above in connection with FIGS. 1 and 2, a photoresist material may be patterned and etched to form masks 160 on the top surface of conductive layer 150. Layers 120-150 may be etched, and the etching may terminate at substrate 110 and form memory cells 210. Alternatively, the etching may terminate at another layer, e.g., layer 140, followed in one implementation by additional etching, to form memory cells 210.

As further shown in FIG. 13, process 1300 may optionally form a liner layer over the etched base layers (block 1330). For example, in one implementation described above in connection with FIG. 3, optional liner layer 310 may be formed over the entire surface of semiconductor device 100. Liner layer 310 may be formed on semiconductor device 100 in a conventional manner and may include a dielectric material, such as an oxide (e.g., $SiO_2$, a high quality oxide that includes a high breakdown voltage, etc.).

Process 1300 may form a protection layer over the liner layer (block 1340). For example, in one implementation described above in connection with FIG. 4, protection layer 410 may be formed over the entire surface of liner layer 310. In another implementation, if liner layer is omitted 310, protection layer 410 may be formed over the entire surface of semiconductor device 100. Protection layer 410, in one implementation, may be formed on semiconductor device 100 in a conventional manner and may include a dielectric material, such as a nitride (e.g., a silicon nitride, a silicon-rich nitride, etc.), an oxynitride, another dielectric material capable of preventing diffusion of oxygen, etc.

As further shown in FIG. 13, process 1300 may form source and drain regions and spacers in the semiconductor device (block 1350). For example, in one implementation described above in connection with FIG. 2, source regions 220 and drain regions 230 may be formed in substrate 110. For example, n-type or p-type impurities may be implanted in substrate 110 to form source regions 220 and drain regions 230, based on the particular end device requirements. In one implementation described above in connection with FIG. 5, spacers 510 may be formed adjacent the sidewalls of the memory cells 210. Spacers 510 may electrically isolate adjacent memory cells 210 from each other. Spacers 510 may also facilitate the deposition of impurities in semiconductor device 100.

Process 1300 may form the remaining semiconductor device (block 1360). For example, in one implementation described above in connection with FIGS. 6A-12B, ILD 610 may be deposited over semiconductor device 100 (FIG. 6A) and may optionally be planarized (FIG. 6B). Contact hole 710 may be formed in ILD 610 (FIG. 7A), and contact 720 may be deposited in contact hole 710 (FIG. 7B). Conductive interconnect line 810 may be formed over the planarized top surfaces of ILD 610 and contact 720 (FIG. 8), and ILD 910 may be formed over conductive line 810 (FIG. 9). Via 1010 may be formed in ILD 910 (FIG. 10), conductive line 1110 may be formed over ILD 910 and via 1010 (FIG. 11), and cap layer 1210 may be formed over conductive line 1110 (FIGS. 12A and 12B).

CONCLUSION

Implementations consistent with principles of the invention may relate to the protection of memory cells used in memory devices from oxidation-enhanced diffusion, bird's beak formation, and/or mobile ion penetration. By providing a protection layer over the side surfaces of memory cells and over the source and/or drain regions, a memory device may be fabricated that is substantially free from oxidation-enhanced diffusion, bird's beak formation, and/or mobile ion penetration. For example, in one implementation, a nitride protection layer may be provided after formation of the memory cells and/or prior to formation of spacers adjacent the side surfaces of the memory cells.

The foregoing description of preferred embodiments provides illustrations and descriptions, but is not intended to be exhaustive or to limit the invention to the precise form disclosed. Modifications and variations are possible in light of the above teachings or may be acquired from practice of the invention.

For example, numerous specific details are set forth, such as specific materials, structures, chemicals, processes, etc., in order to provide a thorough understanding of the invention. However, implementations consistent with principles of the invention may be practiced without resorting to the details specifically set forth herein. In other instances, well known processing structures have not been described in detail, in order not to unnecessarily obscure the thrust of the invention.

Furthermore, while a series of acts has been described with regard to FIG. 13, the order of the acts may be modified in other implementations consistent with principles of the invention. Further, non-dependent acts may be performed in parallel.

As described above, semiconductor device 100 consistent with principles of the invention may be a SONOS type memory device, and/or a floating gate memory device. Such a semiconductor device 100 may be used for a variety of applications. For example, semiconductor device 100 may be used in chip sets included in computers, e.g., a personal computer, a laptop, a printer, a monitor, etc., and consumer electronics (e.g., a camera, a calculator, a television, stereo equipment, a radio, a home entertainment system, an MP3 player, a DVD player, video game systems, etc.).

Semiconductor device 100 may also be used in telecommunications equipment, e.g., a radiotelephone handset; a personal communications system (PCS) terminal that may combine a cellular radiotelephone with data processing, a facsimile, and data communications capabilities; a personal digital assistant (PDA) that can include a radiotelephone, pager, Internet/intranet access, web browser, organizer, calendar, a camera, a sound recorder, a Doppler receiver, and/or global positioning system (GPS) receiver; a GPS device; etc.

Semiconductor device 100 may further be used in industrial applications, e.g., electronic sensors, electronic instruments, industrial control systems, network devices (e.g., a router, a switch, set top boxes, a network interface card (NIC), a hub, a bridge, etc.), etc., and automotive applications, e.g., engine control systems, safety control equipment (e.g., airbags, cruise control, collision avoidance, antilock brakes, etc.), and cockpit electronics (e.g., entertainment, instrumentation, phones, etc.), etc.

Although a variety of applications for semiconductor device 100 have been described, the list of applications for semiconductor device 100 is exemplary and may include other applications not mentioned above.

Implementations of the invention are applicable in the manufacturing of semiconductor devices and particularly in memory devices having small design features and high circuit density. The invention is also applicable to the formation of any of various other types of semiconductor devices in which high circuit density is important, and hence, details have not been set forth in order to avoid obscuring the thrust of the invention.

It should be emphasized that the term "comprises/comprising" when used in the this specification is taken to specify the presence of stated features, integers, steps or components but does not preclude the presence or addition of one or more other features, integers, steps, components or groups thereof.

No element, act, or instruction used in the present application should be construed as critical or essential to the invention unless explicitly described as such. Also, as used herein, the article "a" is intended to include one or more items. Where only one item is intended, the term "one" or similar language is used, Further, the phrase "based on" is intended to mean "based, at least in part, on" unless explicitly stated otherwise.

What is claimed is:

1. A memory device, comprising:
    a substrate;
    a plurality of memory cells, each memory cell, of the plurality of memory cells, including:
        a first dielectric layer formed over the substrate,
        a charge storage layer formed over the first dielectric layer,
        the charge storage layer including a nitride,
        a second dielectric layer formed over the charge storage layer, and
        a control gate layer formed over the second dielectric layer;
    a plurality of source regions formed in the substrate, each source region, of the plurality of source regions, being formed adjacent to a first side of each memory cell of the plurality of memory cells;
    a plurality of drain regions formed in the substrate, each drain region, of the plurality of drain regions, being formed adjacent to a second side, of each of the plurality of memory cells, that is opposite the first side;
    a protection layer formed on: a top surface of each of the plurality of source regions, a top surface of each of the plurality of drain regions, the first dielectric layer of each of the plurality of memory cells, the charge storage layer of each of the plurality of memory cells, the second dielectric layer of each of the plurality of memory cells, and the control gate layer of each of the plurality of memory cells,
    the protection layer including oxynitride, and
    a thickness of the protection layer ranging from about 50 Å to about 150 Å;
    spacers formed:
        in contact with the protection layer, and
        on opposite sides of each of the plurality of memory cells;
    a third dielectric layer formed over each of the plurality of memory cells and the spacers, the third dielectric layer contacting:
        a top of surface of the control gate layer, of each of the plurality of memory cells, and a portion of the spacers; and
        a contact formed between each of the plurality of memory cells, the contact contacting the spacers and the third dielectric layer, and the contact not substantially contacting the plurality of memory cells.

2. The memory device of claim 1, where the protection layer comprises a dielectric material that minimizes diffusion of oxygen, and
    where the protection layer at least one of minimizes or prevents formation of bird's beaks below the plurality of memory cells.

3. A memory device, comprising:
    a substrate;
    a first dielectric layer formed over the substrate;
    a charge storage layer formed over the first dielectric layer;
    a second dielectric layer formed over the charge storage layer;
    a control gate layer formed over the second dielectric layer;
    a source region formed in the substrate;
    a drain region formed in the substrate;
    a liner layer formed on:
        a top surface of the source region,
        a top surface the drain region, and
        side surfaces of the first dielectric layer, the charge storage layer, the second dielectric layer, and the control gate layer, the liner layer contacting one or more of the first dielectric layer, the charge storage layer, the second dielectric layer, or the control gate layer;
    a protection layer formed on side surfaces of the liner layer;
    spacers formed:
        in contact with the protection layer, and
        on opposite sides of the first dielectric layer, the charge storage layer, the second dielectric layer, and the control gate layer;
    a third dielectric layer formed over the first dielectric layer, the charge storage layer, the second dielectric layer, the control gate layer, and the spacers, the third dielectric layer contacting:
        a top of surface of the control gate layer, and
        a portion of the spacers; and
    a contact formed in contact with one of the spacers and a portion of the third dielectric layer, the contact not substantially contacting the first dielectric layer, the charge storage layer, the second dielectric layer, and the control gate layer.

4. The memory device of claim 3, where a thickness of the liner layer ranges from about 50 Å to about 500 Å.

5. The memory device of claim 3, where a thickness of the liner layer ranges from about 50 Å to about 500 Å.

6. The memory device of claim 3, where the protection layer:
    comprises a dielectric material that minimizes diffusion of oxygen at least one of minimizes or prevents non-uniform thickening of one or more of the first dielectric layer or the second dielectric layer, and
    at least one of minimizes or prevents mobile ion penetration in the memory device from back end of line (BEOL) processing.

7. The memory device of claim 3, where a thickness of the protection layer ranges from about 50 Å to about 500 Å.

8. The memory device of claim 3, where a thickness of the protection layer ranges from about 50 Å to about 500 Å.

9. A memory device, comprising:
    a plurality of memory cells formed on a substrate, each memory cell, of the plurality of memory cells, being associated with a source region and a drain region that are formed in the substrate, at least one of the plurality of memory cells comprising:
        a first dielectric layer formed over the substrate,
        a charge storage layer formed over the first dielectric layer,
        a second dielectric layer formed over the charge storage layer, and
        a control gate layer formed over the second dielectric layer;
    a protection layer formed: above a top surface of the source region associated with each of the plurality of memory cells, a top surface of the drain region associated with each of the plurality of memory cells, and on side surfaces of each of the plurality of memory cells;
spacers formed in contact with the protection layer and on opposite sides of each of the plurality of memory cells, the protection layer being formed between each of the spacers and a corresponding side surface of each of the plurality of memory cells;
a third dielectric layer formed over each of the plurality of memory cells and the spacers, the third dielectric layer contacting:
a top of surface of each of the plurality of memory cells, and
a portion of the spacers; and
a contact formed between each of the plurality of memory cells, the contact contacting the spacers, and the contact not substantially contacting the plurality of memory cells.

10. The memory device of claim 9, where a thickness of the protection layer ranges from about 50 Å to about 500 Å.

11. The memory device of claim 9, where a thickness of the protection layer ranges from about 50 Å to about 500 Å.

12. The memory device of claim 9, further comprising:
a liner layer formed:
directly on the top surfaces of the source regions and the drain regions associated with the plurality of memory cells, and
on the side surfaces of the plurality of memory cells, the liner layer being formed between the protection layer and each of the plurality of memory cells, the protection layer being formed on a top surface of the liner layer, the protection layer including oxynitride.

13. The memory device of claim 12, where the liner layer comprises an oxide.

14. The memory device of claim 12, where a thickness of the liner layer ranges from about 50 Å to about 500 Å.

15. The memory device of claim 12, where a thickness of the liner layer ranges from about 50 Å to about 500 Å.

16. The memory device of claim 1, further comprising:
a liner layer formed in contact with:
the top surface of the source region,
the top surface of the drain region, and
side surfaces of each of the plurality of memory cells,
the liner layer being formed between the protection layer and each of the plurality of memory cells.

* * * * *